United States Patent
Sekine

(10) Patent No.: US 6,853,008 B2
(45) Date of Patent: Feb. 8, 2005

(54) SEMICONDUCTOR DEVICE AND MANUFACTURING METHOD THEREOF

(75) Inventor: Norihiko Sekine, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/963,485

(22) Filed: Sep. 27, 2001

(65) Prior Publication Data

US 2002/0074546 A1 Jun. 20, 2002

(30) Foreign Application Priority Data

Dec. 15, 2000 (JP) ........................................ 2000-382697

(51) Int. Cl.[7] .................... H01L 29/04; H01L 31/036
(52) U.S. Cl. ............................. 257/94; 257/96; 257/97; 257/103; 257/627; 438/22; 438/46; 438/47; 438/48; 372/43
(58) Field of Search ............................. 257/94–97, 103, 257/100, 627; 438/22, 46–48, 455, 470; 372/43

(56) References Cited

U.S. PATENT DOCUMENTS 5,780,873 A * 7/1998 Itaya et al. ................. 257/521

FOREIGN PATENT DOCUMENTS

| JP | 61-183915 | 8/1986 |
|----|-----------|--------|
| JP | 5-267790 | 10/1993 |
| JP | 6-349692 | 12/1994 |

OTHER PUBLICATIONS

J.Piprek et al., "Abrupt self–switching in fused GaAs/Inp vertical–cavity lasers", CLEO'99, May 27, 1999, pp 458.*
Patent Abstracts of Japan; Publication No.: 06090061 A; Date of Publication: Mar. 29, 1994. Abstract only.
R.J. Ram et al.; *GaAs to InP Wafer Fusion*; Journal of Applied Physics; vol. 78, pp 4227–4237; 1995.

* cited by examiner

*Primary Examiner*—Donghee Kang
(74) *Attorney, Agent, or Firm*—Westerman, Hattori, Daniels & Adrian, LLP

(57) ABSTRACT

A semiconductor device has a structure in which a GaAs substrate and an InP substrate, different in lattice constant, are bonded to each other. An amorphous layer made of constituent atoms of the GaAs and InP substrates is formed at the interface between the GaAs and InP substrates. Forming the amorphous layer makes it possible to prevent a reduction of light-emitting efficiency caused by a thermal stress at the interface, even when a light-emitting layer by laser oscillation is formed near the interface. Besides, a linear current-voltage characteristic can be obtained at the interface.

8 Claims, 5 Drawing Sheets ns is different from each other, a problem occurs that stress is generated in the bonding interface when the substrates are thermally treated for bonding. This is because the thermal treatment in the bonding process causes constituent atoms of the substrates to move and be combined with each other on the interface on an atomic level, and thereafter, the stress due to the combination including different lattice constants is preserved.
SEMICONDUCTOR DEVICE AND MANUFACTURING METHOD THEREOF

CROSS-REFERENCE TO RELATED APPLICATIONS

This application is based upon and claims priority of Japanese Patent Application No. 2000-382697, filed on Dec. 15, 2000, the contents being incorporated herein by reference.

BACKGROUND OF THE INVENTION

1. Field of the Invention

The present invention relates to semiconductor devices, in particular, having structures in which substrates composed of semiconductor materials different from each other are bonded together, and manufacturing methods thereof.

2. Description of the Related Art

Recently, in order to realize integration of semiconductor materials of different kinds such as gallium arsenide (GaAs) and indium phosphide (InP) in a semiconductor device which uses, for example, compound semiconductor materials, technology of directly bonding together semiconductor substrates which use these materials has been utilized.

The technology of bonding substrates as described above is disclosed, for example, in Japanese Patent Application Laid-open No. 61-183915 and a paper, R. J. Ram et al., J. Appl. Phys. Vol. 78, 4227 (1995). In this technology, substrates are bonded in a manner in which surfaces of the substrates are compressively bonded with each other after being subjected to cleaning treatment and in this state, are subjected to thermal treatment in a reducing atmosphere (for example, hydrogen).

FIG. 6A is a diagrammatic sectional view showing a state in which a semiconductor substrate 11 and a semiconductor substrate 12 are bonded with each other according to this method. In the conventional bonding method, annealing time at bonding temperature is set very short (for example, approximately 30 minutes at a temperature of approximately 450° C.) due to a fear of deterioration in crystallinity. A region including an interface of the semiconductor substrate 11 and the semiconductor substrate 12 is structured to include structural contact between substrates to form atomic level bonding, as shown in FIG. 6A.

In this way, when the substrates are brought into mutual contact and bonded together, there is no need to consider lattice matching of materials of the two substrates. This makes it possible to perform the bonding operation without being restricted by kinds of semiconductors. Furthermore, defects in crystallinity are limited only in the vicinity of the interface so that crystallinity with a small amount of defects is obtainable in other regions.

However, when the substrates are brought into mutual contact and bonded together, substrates with different lattice constants are forced to be bonded. In this case, since thermal expansion coefficients of semiconductors of different kinds are different from each other, a problem occurs that stress is generated in the bonding interface when the substrates are thermally treated for bonding. This is because the thermal treatment in the bonding process causes constituent atoms of the substrates to move and be combined with each other on the interface on an atomic level, and thereafter, the stress due to the combination including different lattice constants is preserved.

An atom rearranging layer including a stress is used for the bonding, for example, in Japanese Patent Application Laid-open No. 5-267790. With this stress existing on the interface, when a light-emitting layer such as a quantum well is arranged in the vicinity of the interface, the light-emitting layer is influenced by the stress to deteriorate the crystallinity. Consequently, the deterioration of the crystallinity lowers light-emitting efficiency. Particularly, when the bonding interface is applied to a surface emitting type laser, the light-emitting efficiency lowers greatly since the surface emitting type laser has a structure in which the light-emitting layer is very close to the interface.

As means for reducing the stress, Japanese Patent Application Laid-open No. 6-349692 discloses that an intermediate bonding layer is formed on the bonding interface of semiconductor substrates of different kinds. However, when this technology is to be applied to, for example, the surface emitting type laser, forming the intermediate bonding layer affects the film thickness of an epitaxial layer in a vertical direction to the substrates to give influence to a device characteristic, which results in restriction of device design. Moreover, since the formation of the intermediate bonding layer necessitates a new process, a problem that a whole process is complicated arises.

Furthermore, a problem occurs in an electrical characteristic of the bonding interface. This is a problem that a current-voltage characteristic becomes nonlinear since an energy band changes discontinuously due to a steep characteristic of the bonding interface.

FIG. 6B is a graph showing a discontinuous state of the energy band due to the steep characteristic of the interface. In the bond shown in FIG. 6A, an energy barrier is formed and an energy change on the interface is in a discontinuous state so that the energy band changes discontinuously between the semiconductor substrate 11 and the semiconductor substrate 12. As the bonding on the atomic level is performed more appropriately, an electrical barrier for an electron becomes bigger. When this technology of substrate bonding is applied to a device such as the surface emitting type laser, a current crosses the bonding interface to cause an increase in driving voltage.

Moreover, the steep change of the energy band causes the current-voltage characteristic to be nonlinear as shown in FIG. 6C. The nonlinear current-voltage characteristic on the interface causes a problem of great degeneration in controllability of an element.

For example, when the bonding interface having this nonlinear current-voltage characteristic is applied to an optical device such as a light-emitting element, it is very difficult to control light-emitting quantity thereof and weak light emitting cannot be performed. In addition, when it is applied to a photodetector, a problem of degeneration in detection accuracy is caused.

As for the nonlinearity of an electrical characteristic, Japanese Patent Application Laid-open No. 6-90061 discloses that a linear current-voltage characteristic is obtainable. However, it is impossible to avoid the problem as described above that an optical characteristic is ruined when the light-emitting layer is near the interface.

As described above, the conventional technology of substrate bonding is not capable of solving both of the problems of the deterioration in the optical characteristic in the vicinity of the interface and of the nonlinearity of the current-voltage characteristic on the interface at the same time.

SUMMARY OF THE INVENTION

It is an object of the present invention to prevent reduction in light-emitting efficiency which is caused by thermal stress on a bonding interface and obtain linearity of a current-voltage characteristic on the interface.

According to an aspect of the present invention, a semiconductor device has a structure in which first and second semiconductor substrates with different lattice constants from each other are bonded together. In the semiconductor device, an amorphous layer composed of constituent atoms of the first and second semiconductor substrates is formed on the bonding interface of the first and second semiconductor substrates.

According to another aspect of the present invention provided is a manufacturing method of the above-described semiconductor device. This manufacturing method comprises a first step of compressively bonded surfaces of semiconductor substrates of different kinds with different lattice constants from each other and a second step of giving thermal treatment to the semiconductor substrates of different kinds to form an amorphous layer over the bonding interface of the semiconductor substrates of different kinds. In the second step, the thermal treatment is given for one hour or longer at a temperature of 550° C. or higher.

Since the present invention is constructed as described above, the amorphous layer which is formed over the interface of the first and second semiconductor substrates minimizes stress on the bonded interface which is caused by a thermal expansion coefficient difference between both substrates. Moreover, the amorphous layer smoothens an electrical barrier on the interface so that linearity of a current-voltage characteristic of the interface is secured. Furthermore, since the amorphous layer is formed by mutual diffusion of constituent atoms which occurs in the step of the thermal treatment, bonding the substrates and forming the amorphous layer are performed at the same time to prevent the number of processes from increasing.

DETAILED DESCRIPTION OF THE PREFERRED EMBODIMENTS

Hereinafter, an embodiment of the present invention will be described with reference to drawings.

Figure 1A:
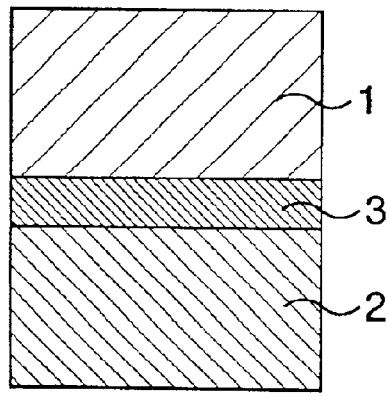
FIGS. 1A to 1C are representations for explaining characteristics of a bonded substrate according to an embodiment of the present invention.
Figure 1B:
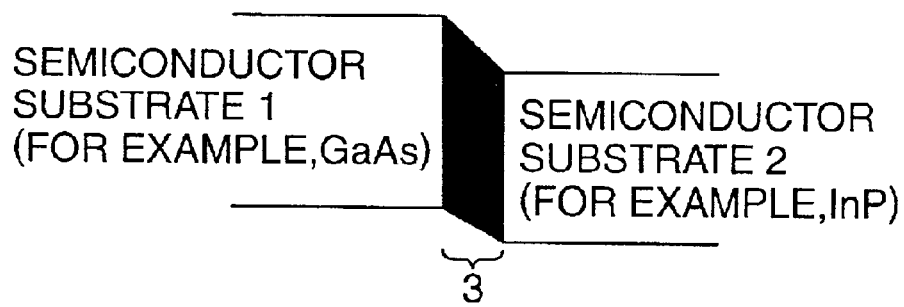
Figure 1C:
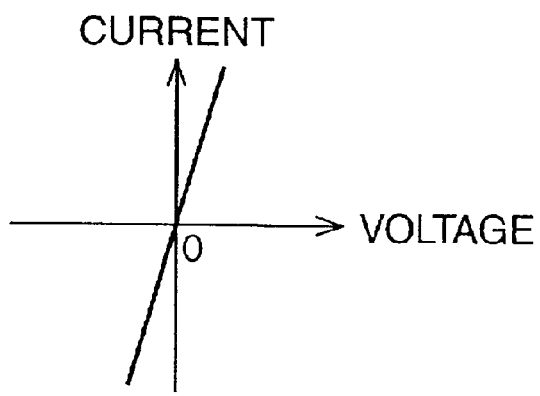

FIGS. 1A to 1C are representations for explaining a principle of a semiconductor device according to an embodiment of the present invention and showing a structure realized in the present invention.

As shown in FIG. 1A, an amorphous layer 3 is formed on an interface between a semiconductor substrate 1 and a semiconductor substrate 2 in a bonded structure of the semiconductor substrates according to this embodiment. Therefore, the semiconductor substrate 1 and the semiconductor substrate 2 are bonded to each other with the amorphous layer 3 being interposed between them. The amorphous layer 3 has a thickness of approximately 1 nm to 3 nm and is formed to be substantially even in thickness over the interface. The semiconductor substrate 1 is, for example, a GaAs substrate and the semiconductor substrate 2 is, for example, an InP substrate.

The semiconductor substrate 1 and the semiconductor substrate 2 are bonded together while being subjected to a thermal treatment at a high temperature of 550° C. or higher for an annealing time of one hour or longer. The long thermal treatment at such a high temperature makes it possible to promote mutual diffusion of atoms in the vicinity of the interface and form the amorphous layer 3 with a substantially even film thickness over the interface. When the amorphous layer 3 is formed to have a film thickness of approximately 1 nm or more, it can be surely formed all over the interface. This makes it possible to prevent the semiconductor substrate 1 and the semiconductor substrate 2 from being in direct contact with each other.

The atoms of the semiconductor substrate 1 and the semiconductor substrate 2 diffuse mutually in the amorphous layer 3. Therefore, when the GaAs substrate and the InP substrate are used as the semiconductor substrates 1 and 2, respectively, in the amorphous layer 3, a value for an inter-atomic distance approximates to a lattice constant of GaAs (0.56333 nm (5.6333 Å)) in a region closer to the GaAs substrate and in a region closer to the InP substrate, the inter-atomic distance approximates to a lattice constant of InP (0.58686 (5.8686 Å)), and the inter-atomic distance gradually changes in a direction of the thickness.

Crystallinity in the vicinity of the interface is ruined to some degree when the amorphous layer 3 is formed. On the other hand, an electrical characteristic and an optical characteristic can be improved. The improvement in the electrical characteristic will be described first with reference to FIG. 1B and FIG. 1C.

FIG. 1B shows an energy band on the interface which is structured as shown in FIG. 1A. In this embodiment, the amorphous layer 3 is formed by mutual diffusion so that material composition changes smoothly. This makes it possible to make the energy band smooth as shown in FIG. 1B. As a result, a linear characteristic as shown in FIG. 1C is obtainable in a current-voltage characteristic.

Furthermore, forming the amorphous layer 3 enables the optical characteristic to improve. This is because stress on the bonding interface which is caused by the thermal expansion coefficient difference between the two semiconductor substrates can be relaxed by the amorphous layer 3. This makes it possible to prevent the semiconductor substrates 1 and 2 on both sides of the bonding interface from being influenced by the stress caused by bonding. As a result, light-emitting efficiency can be prevented from decreasing even when a light-emitting layer is disposed in the vicinity of the interface. Incidentally, the ruin in the crystallinity is limited within a region of a film thickness of approximately 3 nm in the vicinity of the interface, and therefore, it does not influence most of the part other than the region.

As described above, according to the structure in this embodiment, the amorphous layer 3 is formed over the bonding interface so that it is made possible to integrate different semiconductor materials while deterioration in the electrical and optical characteristics is suppressed. Thereby, selectivity of an element structure increases to realize a semiconductor element with high performance.

This embodiment is applicable to bonding between GaAs substrates having a compound semiconductor layer of 0 layers or one layer or more (a general formula: $Al_xGa_{1-x}As$ (x is a number from 0 to 1)) and between InP substrates having a compound semiconductor layer of 0 layers or one layer or more (a general formula: $In_{1-x}Ga_xAs_yP_{1-y}$ (x and y are both numbers from 0 to 1)). In addition, this embodiment is applicable to bonding of various semiconductor substrates of different kinds with different lattice constants from each other. For example, it is also applicable to bonding of a GaAs substrate on a silicon (Si) substrate and so on in an optical device and so on. Forming the amorphous layer 3 on the bonding interface makes it possible to minimize characteristic deterioration on the interface. As a result, selectivity of materials for both substrates is greatly expanded.

As described above, according to this embodiment, when the two semiconductor substrates 1 and 2 with different lattice constants from each other are bonded together, the amorphous layer 3 utilizing the mutual diffusion is formed over the interface so that the linearity of the current-voltage characteristic on the interface is obtainable. Moreover, the formed amorphous layer 3 has an effect of lessening the stress caused by the thermal expansion coefficient difference so that an interface of good quality from an optical point of view is also obtainable without ruining the light-emitting efficiency.

As a result, it is made possible to minimize the deterioration in the electrical and optical characteristics even when the bonding interface between the semiconductor substrates of different kinds is included as a part of a device and to achieve a remarkable improvement in performance and reliability of the device.

EXAMPLES

Examples wherein the above embodiment is applied in a specific manner will be described below.

Figure 2:
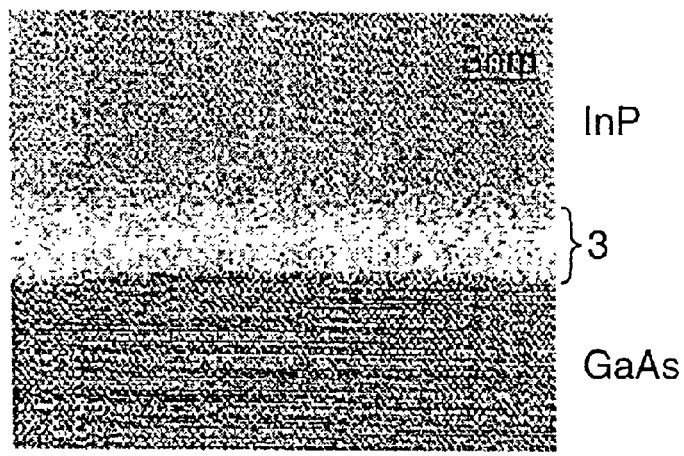
FIG. 2 is a schematic view showing a section when an amorphous layer is formed on a bonding interface.

FIG. 2 shows a sectional photography of a specimen taken by an electron microscope where the InP substrate and the GaAs substrate, which are semiconductors of different kinds, are bonded together and the amorphous layer 3 is formed over the interface when the embodiment as described above is applied in a specific manner. This specimen was made with the use of a furnace in a hydrogen atmosphere. The two substrates were cleaned with water after surface oxide films thereon were removed, surfaces of the substrates were brought into close contact with each other in water, the substrates were then dried while being in close contact with each other, and finally they were treated in the hydrogen atmosphere at a temperature of approximately 550° C. for one hour during being compressively bonded with each other under a pressure of approximately 100 g/cm². In this way, the amorphous layer 3 was formed at the interface between the two substrates. From FIG. 2, it is apparent that the amorphous layer 3 with a film thickness of approximately 3 nm was formed between the InP substrate on the upper side and the GaAs substrate on the lower side.

Figure 3:
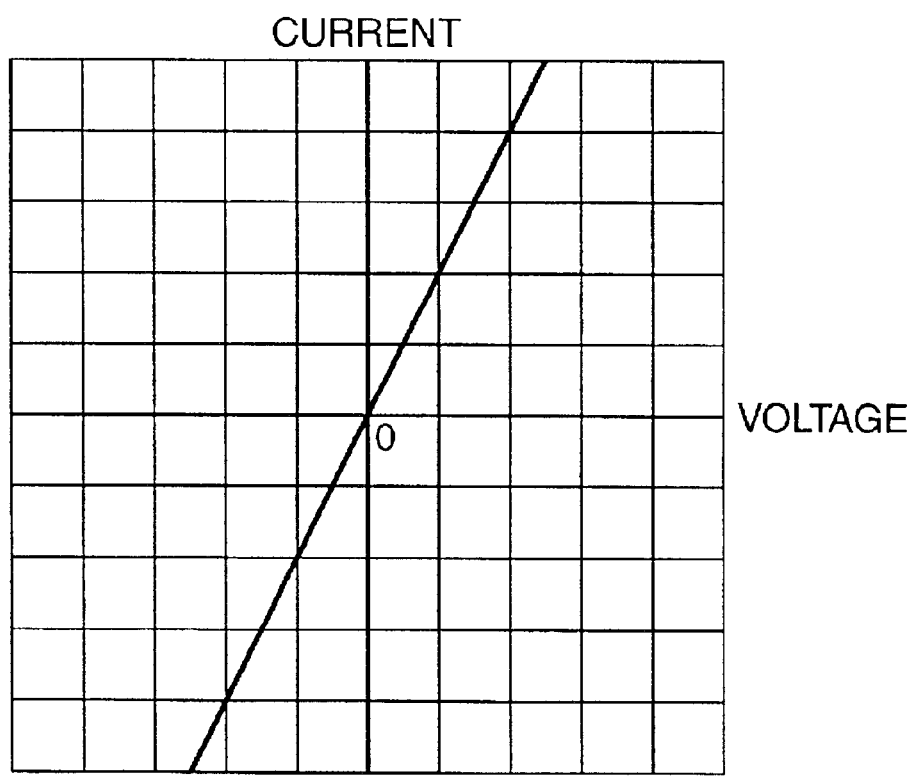
FIG. 3 is a graph showing measured values for a current-voltage characteristic of a specimen when the amorphous layer is formed on the bonding interface.

FIG. 3 shows a result of measuring the current-voltage characteristic while a current was passed through the specimen in FIG. 2. As shown in FIG. 3, the apparently linear current-voltage characteristic could be obtained on the bonded substrates according to this embodiment.

Figure 4:
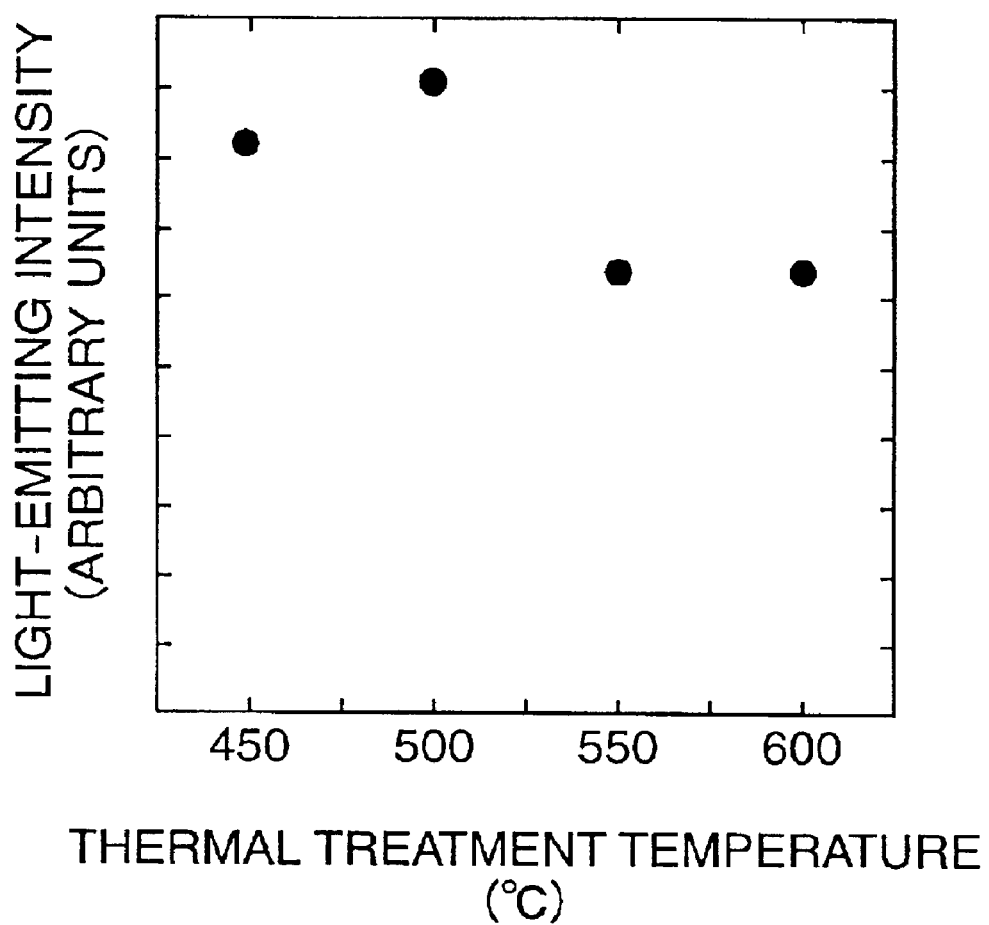
FIG. 4 is a graph showing a change in light-emitting intensity relative to bonding temperature.

Furthermore, it was confirmed from this specimen that the deterioration in the optical characteristic could be prevented. FIG. 4 shows a change in light-emitting intensity relative to bonding temperature when a quantum well light-emitting layer is provided in a position 300 nm away from the bonded interface of this specimen. As shown in FIG. 4, it is apparent that the light-emitting intensity did not decrease even at a high temperature of the thermal treatment to be used for forming the amorphous layer 3 and the stress on the interface was relaxed on the amorphous layer 3.

When the two substrates are brought into contact with each other and combined on an atomic level without forming the amorphous layer 3, atomic movements become active in accordance with an increase in temperature. Therefore, it is possible to bond the substrates with different lattice constants to each other. However, the stress after they are bonded increases in accordance with the temperature at the time of bonding. Consequently, as the substrates are bonded together at the higher temperature, the light-emitting intensity decreases more. Forming the amorphous layer 3 makes it possible to minimize a stress occurrence and to prevent the light-emitting intensity from decreasing.

Figure 5:
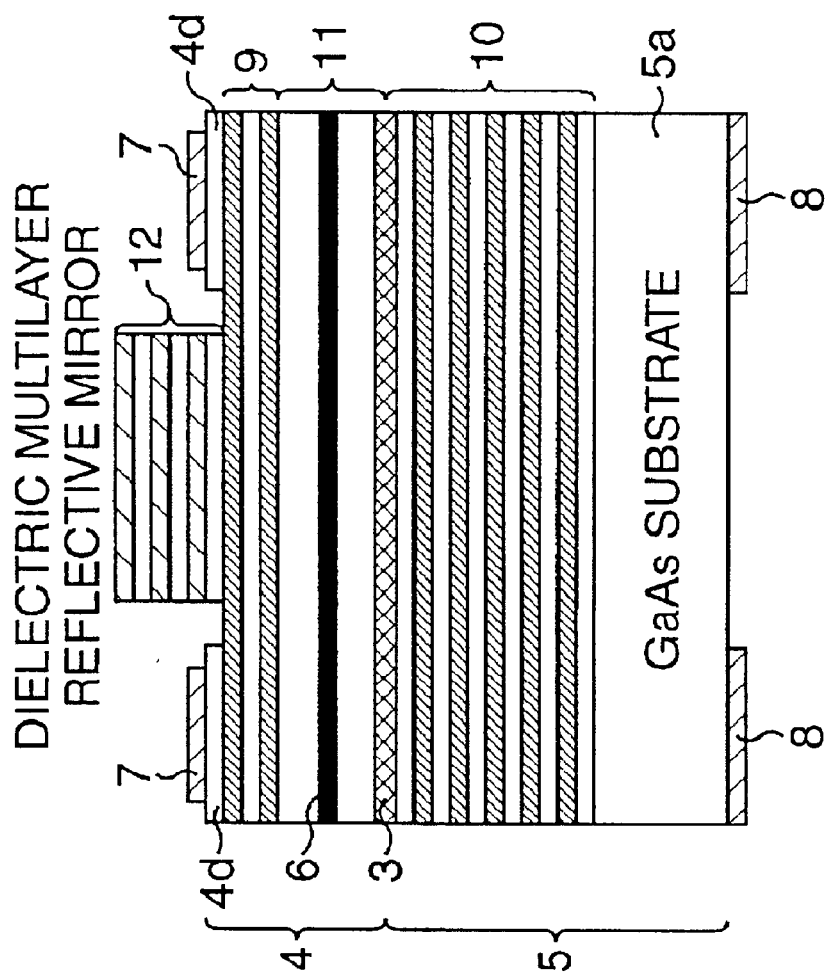
FIG. 5 is a schematic sectional view showing the structure of a surface emitting type laser.
Figure 6A:
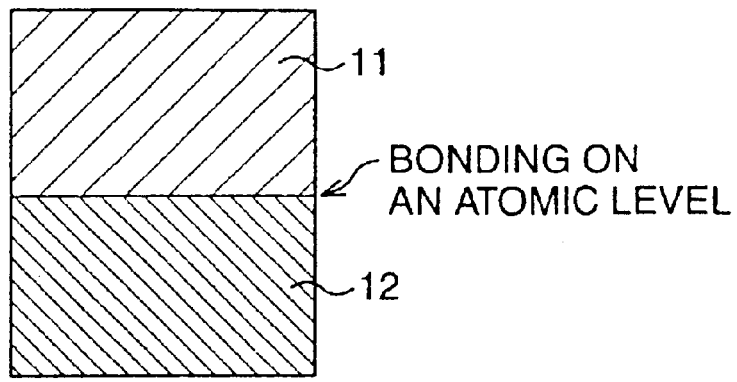
FIGS. 6A to 6C are representations for explaining characteristics of conventional bonded substrates.
Figure 6B:
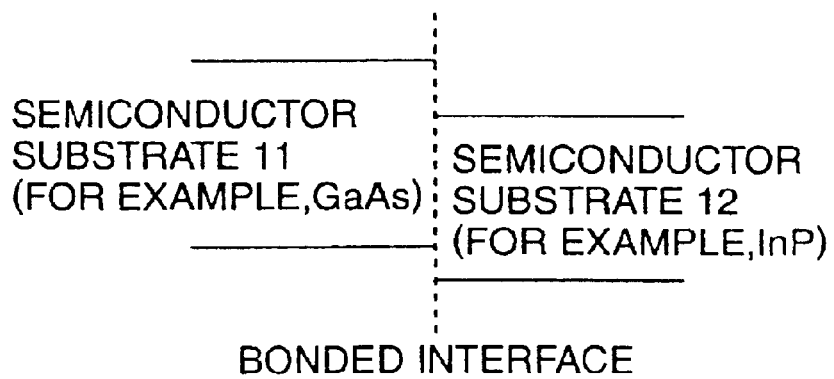
Figure 6C:
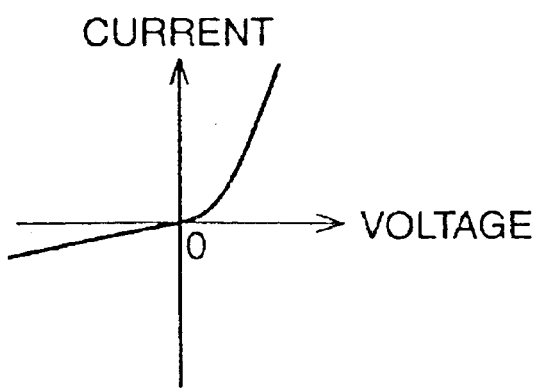

Next, an example wherein the structure in the above embodiment is applied to a specific semiconductor device will be described. Here, the above embodiment is applied to a surface emitting type laser. FIG. 5 is a schematic sectional view showing the structure of the surface emitting type laser according to this example.

The surface emitting type laser has a structure in which an n-type GaAs laminated substrate 5 is bonded on an n-type $In_{0.31}Ga_{0.69}As$ laminated substrate 4 with an active layer 6 being formed therein. A current is passed between an electrode 7 on the n-type $In_{0.31}Ga_{0.69}As$ laminated substrate 4 and an electrode 8 on the n-type GaAs laminated substrate 5 so that light is emitted in the active layer 6. Forming the active layer 6 in the n-type $In_{0.31}Ga_{0.69}As$ laminated substrate 4 enables the light to be emitted, particularly, in a long wavelength band with a wavelength of approximately 1.3 $\mu$m to 1.5 $\mu$m. Bonding the n-type $In_{0.31}Ga_{0.69}As$ laminated substrate 4 with a relatively low reflectance with the n-type GaAs laminated substrate 5 with a relatively high reflectance realizes a high reflectance.

The light emitted in the active layer 6 is reflected between an $In_{0.31}Ga_{0.69}As$-based multilayer reflective mirror 9 and a dielectric multilayer reflective mirror 12 of the n-type $In_{0.31}Ga_{0.69}As$ laminated substrate 4 and a GaAs/AlAs multilayer reflective mirror 10 of the n-type GaAs laminated substrate 5. Therefore, laminated films on both sides of the active layer 6 work as an oscillator 11. The reflected light is finally discharged to the dielectric multilayer reflective mirror 12 side formed on the n-type $In_{0.31}Ga_{0.69}As$ laminated substrate 4.

Structure examples of the n-type $In_{0.31}Ga_{0.69}As$ laminated substrate 4 and the n-type GaAs laminated substrate 5 are given as follows. The n-type GaAs laminated substrate 5 is composed of a specimen (A) in which 26 pairs of an n-AlAs layer and an n-GaAs layer with a thickness corresponding to $\lambda/4n_1$ ($\lambda$=1.3 $\mu$m, $n_1$: a refractive index) are formed on an n-GaAs substrate 5a.

The n-type $In_{0.31}Ga_{0.69}As$ laminated substrate 4 is composed of a specimen (B) having a p-$In_{0.31}Ga_{0.69}As$ buffer layer 4b (500 nm), a p-$In_{0.785}Ga_{0.215}P$ etching stop layer 4c (100 nm), a p-$In_{0.31}Ga_{0.69}As$ contact layer 4d (400 nm), a p-$In_{0.305}Al_{0.251}Ga_{0.444}As$ layer (20 nm), a p-$In_{0.785}Ga_{0.215}P$ layer (102 nm), a p-$In_{0.305}Al_{0.251}Ga_{0.444}As$ layer (20 nm), a p-$In_{0.31}Ga_{0.69}As$ layer (261 nm), a p-$In_{0.305}Al_{0.251}Ga_{0.444}As$ layer (20 nm), a p-$In_{0.785}Ga_{0.215}P$ layer (81 nm), a p-$In_{0.305}Al_{0.251}Ga_{0.444}As$ cladding layer (163 nm), an i-$In_{0.305}Al_{0.251}Ga_{0.444}As$ layer (10 nm), an i-$In_{0.46}Ga_{0.54}As$ layer (7 nm), an i-$In_{0.305}Al_{0.251}Ga_{0.444}As$ layer (10 nm), an i-$In_{0.46}Ga_{0.54}As$ layer (7 nm), an i-$In_{0.305}Al_{0.251}Ga_{0.444}As$ layer (10 nm), an i-$In_{0.46}Ga_{0.54}As$ layer (7 nm), an i-In$_{0.305}$Al$_{0.251}$Ga$_{0.444}$As layer (10 nm), an n-In$_{0.305}$Al$_{0.251}$Ga$_{0.444}$As cladding layer (163 nm), an n-In$_{0.785}$Ga$_{0.215}$P layer (102 nm), and an n-In$_{0.31}$Ga$_{0.69}$As cover layer (10 nm) which are formed on an In$_{0.31}$Ga$_{0.69}$As substrate. Here, the three i-In$_{0.46}$Ga$_{0.54}$As layers (7 nm) interposed between the n-type and p-type cladding layers work as the active layer 6.

The n-type In$_{0.31}$Ga$_{0.69}$As laminated substrate 4 and the n-type GaAs laminated substrate 5 are bonded together in a manner in which the respective surface oxide films of the specimen (A) and the specimen (B) are washed away and the same thermal treatment as that for the specimen in FIG. 2 is given while the n-GaAs layer, which is a surface layer of the n-type GaAs laminated substrate 5, and the cover layer, which is a surface layer of the n-type In$_{0.31}$Ga$_{0.69}$As laminated substrate 4, are compressively bonded with each other. This makes it possible to form the amorphous layer 3 on the bonding interface between the n-type In$_{0.31}$Ga$_{0.69}$As laminated substrate 4 and the n-type GaAs laminated substrate 5.

After the n-type In$_{0.31}$Ga$_{0.69}$As laminated substrate 4 and the n-type GaAs laminated substrate 5 are bonded together, the InGaAs substrate and the p-InGaAs buffer layer 4b of the n-type In$_{0.31}$Ga$_{0.69}$As laminated substrate 4 are removed and subsequently the p-InGaP etching stop layer 4c on the lower layer is removed. Thereafter, the p-InGaAs contact layer 4d in a region to form the dielectric multilayer film mirror 12 is selectively removed by photolithography and subsequent dry etching.

Thereafter, the dielectric multilayer film mirror 12 composed of an Al$_2$O$_3$/Si (with a film thickness corresponding to $\lambda/4n_1$) is formed by evaporation in the region where the p-InGaAs contact layer 4d has been removed, and then the electrodes 7 and 8 are formed on the n-GaAs substrate 5a and the p-InGaAs contact layer 4d, respectively, to complete the structure as shown in FIG. 5. Since the dielectric multilayer film mirror 12 can secure a high reflectance with a small number of layers, the dielectric multilayer film mirror 12, when being formed on the n-type InP laminated substrate 4 side, is capable of compensating the relatively low reflectance of the multilayer reflective mirror 9.

In the surface emitting type laser in FIG. 5, forming the amorphous layer 3 on the interface between the n-type In$_{0.31}$Ga$_{0.69}$As laminated substrate 4 and the n-type GaAs laminated substrate 5 minimizes the resistance in the interface to the current which passes between the electrode 8 on the n-type GaAs laminated substrate 5 and the active layer 6 to prevent increase in driving voltage. Furthermore, the linearity of the current-voltage characteristic can be secured at the interface. This makes it possible to easily control the light-emitting intensity.

Moreover, forming the amorphous layer 3 can minimize the stress occurring at the bonding interface, which makes it possible to minimize the degeneration in the light-emitting intensity even when the bonding interface is close to the active layer 6.

In addition, forming the active layer 6 in the n-type In$_{0.31}$Ga$_{0.69}$As laminated substrate 4 enables the light to be emitted particularly in a long wavelength band and bonding the n-type GaAs laminated substrate 5 therewith makes it possible to form the reflective mirror with a high reflectance given by the n-type GaAs laminated substrate 5.

According to the present invention, the reduction in the light-emitting efficiency which is caused by the thermal stress on the bonding interface between the semiconductor materials of different kinds can be prevented and the linearity of the current-voltage characteristic on the interface is obtainable.

What is claimed is:

1. A semiconductor device comprising:
    a first and second semiconductor substrates, both being different in lattice constant and bonded with each other,
    wherein an interface between said first and second semiconductor substitutes has a linear current-voltage characteristic, and an amorphous layer made of constituent atoms of said first and second semiconductor substitutes is formed at said interface,
    wherein said first semiconductor substrate is an InP substrate including a compound semiconductor layer of zero layers or one or more layers and said second semiconductor substrate is a GaAs substrate including a compound semiconductor layer of zero layers or one or more layers.

2. The device according to claim 1, wherein one of said first and second semiconductor substrates includes a light-emitting layer.

3. The device according to claim 1, wherein said compound semiconductor layer of said first semiconductor substrate is made of In$_{1-x}$Ga$_x$As$_y$P$_{1-y}$ (x and y are numbers from zero to one).

4. The device according to claim 1, wherein said compound semiconductor layer of said second semiconductor substrate is made of Al$_x$Ga$_{1-x}$As (x as a number from zero to one).

5. The device according to claim 1, wherein said amorphous layer has a thickness of 1 nm or more.

6. A semiconductor device comprising:
    a first and second semiconductor substrates, both being different in lattice constant and bonded with each other,
    wherein said first semiconductor substrate is an InP substrate and said second semiconductor substrate is a GaAs substrate, and
    wherein an interface between said first and second semiconductor substrates has a linear current-voltage characteristic, and an amorphous layer made of constituent atoms of said first and second semiconductor substrates is formed at said interface.

7. The device according to claim 6, wherein one of said first said second semiconductor substrates includes a light-emitting layer.

8. The device according to claim 6, wherein said amorphous layer has a thickness of 1 nm or more.

\* \* \* \* \*